United States Patent [19]
Gochnour et al.

[11] Patent Number: 5,678,301
[45] Date of Patent: Oct. 21, 1997

[54] METHOD FOR FORMING AN INTERCONNECT FOR TESTING UNPACKAGED SEMICONDUCTOR DICE

[75] Inventors: Derek Gochnour, Boise; Warren M. Farnworth, Nampa, both of Id.

[73] Assignee: Micron Technology, Inc., Boise, Id.

[21] Appl. No.: 563,509

[22] Filed: Nov. 27, 1995

Related U.S. Application Data

[63] Continuation-in-part of Ser. No. 338,345, Nov. 14, 1994, which is a continuation-in-part of Ser. No. 73,005, Jun. 7, 1993, Pat. No. 5,408,190, which is a continuation-in-part of Ser. No. 709,858, Jun. 4, 1991, abandoned, Ser. No. 788,065, Nov. 5, 1991, Pat. No. 5,440,240, and Ser. No. 981,956, Nov. 24, 1992, Pat. No. 5,539,324.

[51] Int. Cl.⁶ .................................................. H01R 43/00
[52] U.S. Cl. .................... 29/827; 29/840; 156/634; 257/69; 324/765; 437/8; 437/206; 437/220
[58] Field of Search ............................. 29/827, 846, 840; 437/220, 8, 205, 206; 257/777, 69; 156/634; 324/765

[56] References Cited

U.S. PATENT DOCUMENTS

| | | | |
|---|---|---|---|
| 4,763,409 | 8/1988 | Take Kewa et al. | 29/827 |
| 4,778,564 | 10/1988 | Emamjomeh | 29/827 X |
| 4,814,855 | 3/1989 | Hodgson et al. | |
| 4,899,921 | 2/1990 | Bendat et al. | 228/105 |
| 4,997,517 | 3/1991 | Parthasarathi | 29/827 X |
| 5,072,289 | 12/1991 | Sugimoto et al. | |
| 5,090,118 | 2/1992 | Kwon et al. | 29/843 |
| 5,120,391 | 6/1992 | Ishida | 29/827 X |
| 5,224,264 | 7/1993 | Takahashi et al. | 29/827 |
| 5,225,037 | 7/1993 | Elder et al. | 156/644 |
| 5,302,891 | 4/1994 | Wood et al. | 324/158 |
| 5,313,367 | 5/1994 | Ishiyama | 29/827 X |
| 5,367,253 | 11/1994 | Wood et al. | 324/158.1 |
| 5,367,763 | 11/1994 | Lam | 29/827 |
| 5,408,190 | 4/1995 | Wood et al. | 324/765 |
| 5,440,240 | 8/1995 | Wood et al. | 324/765 |

OTHER PUBLICATIONS

Packard Hughes Interconnect Brochure, "Science Over Art. Our New IC Membrane Test Probe", 1993.
Miyake, Koyoshi et al., "Connectivity Analysis of New 'Known Good Die'Connection System Using Microbumps", Technical Paper, Nitto Denko Corporation, pp. 1–6, 1994.
Yamamoto, Yasuhiko et al., "Evaluation of New Micro-–Connection System Using Microbumps", Technical Paper, Nitto Denko Corporation, ISHM 1993 Proceedings, pp. 370–378.

*Primary Examiner*—Carl J. Arbes
*Attorney, Agent, or Firm*—Stephen A. Gratton

[57] ABSTRACT

A method for forming an interconnect for establishing electrical communication with a semiconductor die is provided. The method includes: providing a microbump tape and then mounting the tape to a substrate with a compliant layer therebetween. The microbump tape includes an insulating film having a pattern of microbump contact members corresponding to a pattern of bond pads on the die. The compliant layer can be formed of a curable adhesive such as a silicone elastomer. A coupon containing a plurality of microbump tapes can be mounted to a substrate wafer which can then be singulated to form a plurality of interconnects. The interconnects can be used with a testing apparatus for testing unpackaged semiconductor dice.

30 Claims, 3 Drawing Sheets

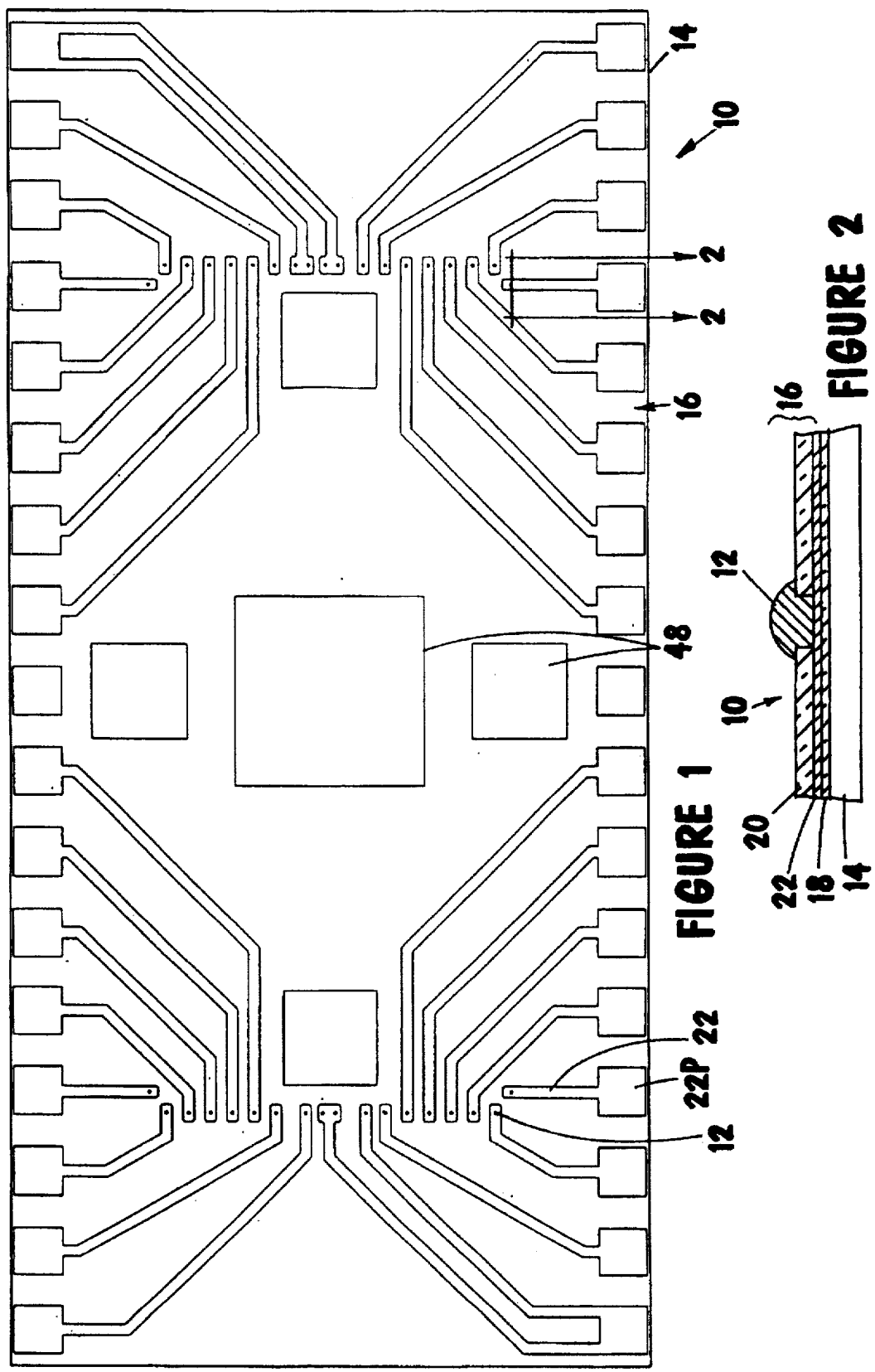

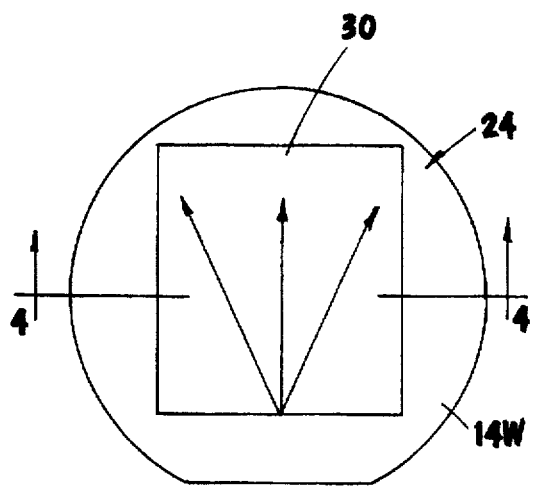
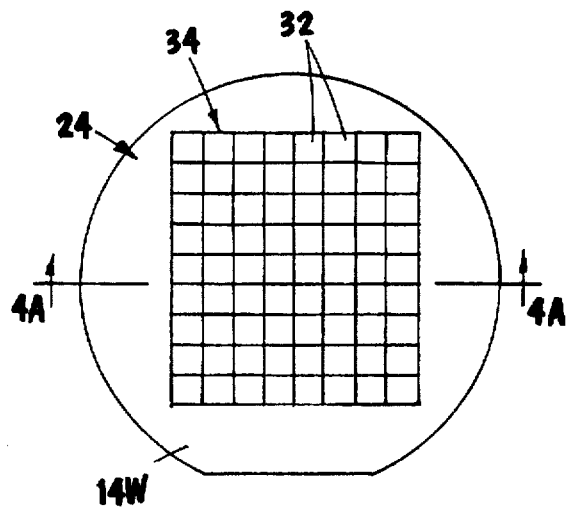
FIGURE 3
FIGURE 3A
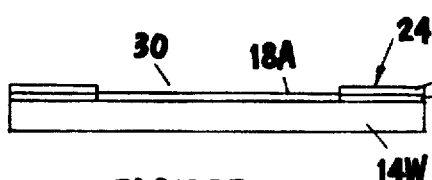
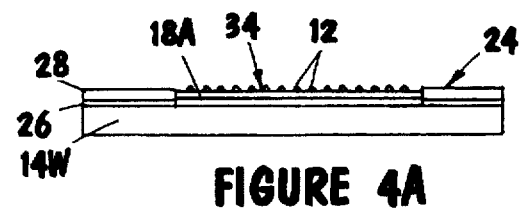
FIGURE 4
FIGURE 4A
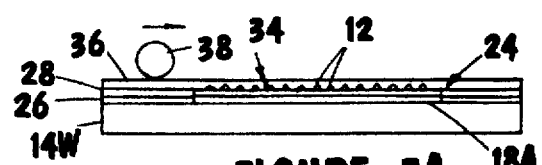
FIGURE 5A
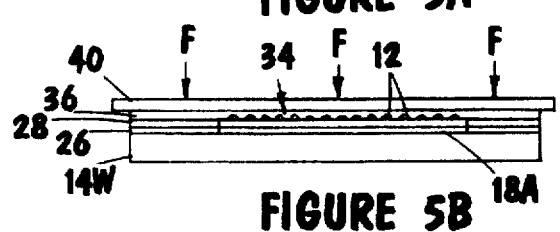
FIGURE 5B

METHOD FOR FORMING AN INTERCONNECT FOR TESTING UNPACKAGED SEMICONDUCTOR DICE

CROSS REFERENCE TO RELATED APPLICATIONS

This application is a continuation-in-part of application Ser. No. 08/338,345 filed Nov. 14, 1994, which is a continuation-in-part of application Ser. No. 08/073,005 filed Jun. 7, 1993, U.S. Pat. No. 5,408,190; which is a continuation-in-part of applications Ser. Nos. 07/709,858 filed Jun. 4, 1991, abandoned; 07/788,065 filed Nov. 5, 1991, U.S. Pat. No. 5,440,240; and, 07/981,956 filed Nov. 24, 1992, U.S. Pat. No. 5,539,324.

FIELD OF THE INVENTION

This invention relates generally to semiconductor manufacture and specifically to the testing of unpackaged semiconductor dice.

BACKGROUND OF THE INVENTION

Microelectronic packages, called "multi chip modules" or "hybrids", are assembled using unpacked semiconductor dice. Prior to the assembly procedure, each unpackaged die must be tested to measure its quality and reliability. This has led to the development of test procedures suitable for testing unpackaged semiconductor dice. Known-good-die (KGD) refers to an unpackaged die having the same quality and reliability as the equivalent packaged die.

Testing includes burn-in testing wherein the dice are heated while the integrated circuits are electrically biased. In addition, the dice are subject to speed and functionality tests to check the performance of the integrated circuits and devices formed on the dice. Among the parameters tested are input and output voltages, capacitance and current specifications. Memory chips are also put through logic tests wherein data storage, retrieval capabilities and response times are measured.

For testing and burning-in unpackaged dice, temporary carriers have been used in the manufacturing process in place of conventional single chip packages. This type of carrier typically includes a base for retaining and housing a single die. The carrier also includes an interconnect that allows a temporary electrical connection to be made between an individual die and external test circuitry. Carriers for testing unpackaged dice are disclosed in U.S. Pat. No. 4,899,107 to Corbett et al., U.S. Pat. No. 5,302,891 to Wood et al. and U.S. Pat. No. 5,408,190 to Wood et al., which are commonly assigned with the present application.

One of the key design considerations for a carrier is the method for establishing a temporary electrical connection with the bond pads on the die. With some carriers, the die is placed circuitry side down in the carrier and biased into contact with the interconnect. The interconnect contains the contact structure that physically aligns with and contacts the bond pads of the die. Exemplary contact structures include wires, needles, and bumps. The mechanisms for making electrical contact include piercing the native oxide of the bond pad with a sharp point, breaking or burnishing the native oxide with a bump, or moving across the bond pad with a contact adapted to scrub away the oxide. In general, each of these contact structures is adapted to form a low-resistance contact with the bondpad.

With this method for testing unpackaged semiconductor dice, it is preferable to perform the test procedure without damaging the die. The bond pads of a die are particularly susceptible to damage by the contact structure of the carrier during formation of the temporary electrical connection. It is also advantageous for the contact structure on the carrier to compensate for differences in the vertical location of the bond pads.

The present invention is directed to an improved method for forming an interconnect suitable for establishing a temporary (or permanent) electrical connection with bond pads or other contact locations on a semiconductor die. The interconnect includes microbump contact members adapted to make a low resistance electrical connection with a die without damaging the bond pads of the die.

It is thus an object of the present invention to provide an improved method for forming an interconnect using low resistance electrical connection with unpackaged semiconductor dice.

It is another object of the present invention to provide an improved method for forming an interconnect using microbump contact members mounted on a compliant adhesive layer to a supporting substrate such as silicon.

It is yet another object of the present invention to provide a method for making an improved interconnect especially suited to testing and burning-in of unpackaged semiconductor dice.

Other objects, advantages, and capabilities of the present invention will become more apparent as the description proceeds.

SUMMARY OF THE INVENTION

In accordance with the present invention, an improved method for forming an interconnect for establishing an electrical connection with an unpackaged semiconductor die is provided. The method of the invention, simply stated, comprises: providing a tape having microbump contact members, and then mounting the tape on a compliant adhesive layer to a supporting substrate.

The microbump tape can be similar in construction to two layer TAB tape used to provide a permanent electrical connection and external leads for packaging semiconductor dice. The microbump tape includes a flexible film, such as polyimide, onto which a pattern of conductors are formed. Preferably the conductors are formed on one side of the film and the microbump contact members are formed in metal filled vias placed through the film to the conductors. This type of microbump tape is commercially manufactured by different manufacturers and is available in coupons containing multiple identical die patterns. The microbump contact members are formed with a size and pitch that corresponds to a particular die bond pad configuration (e.g., edge connect, end connect, lead-on-chip).

The supporting substrate for the interconnect can be a rigid material such as silicon, a ceramic or a metal. Preferably a wafer of material is provided and one or more coupons of tape are attached to the wafer using the compliant adhesive. The compliant adhesive layer can be an elastomeric adhesive such as a silicone elastomer that is applied to a surface of the wafer, evenly spread, and then cured with the tape coupons thereon. Preferably at least a portion of the curing process is performed with a weight on the tape coupons. Following curing, the wafer and individual die patterns are singulated to form a large number of interconnects each suitable for testing an unpackaged semiconductor die.

The interconnects can be used in conjunction with a testing apparatus adapted to retain the unpackaged die and connect to external test circuitry. The die and interconnect are placed within the testing apparatus with the microbump contact members on the interconnect in contact with contact locations (e.g., bond pads) on the die. The conductors on the tape are placed in electrical communication with external contacts on the carrier by wire bonding or other interconnection method.

BRIEF DESCRIPTION OF THE DRAWINGS

FIG. 1 is a plan view of an interconnect constructed in accordance with the invention;

FIG. 2 is an enlarged cross sectional view taken along section line 2—2 of FIG. 1;

FIG. 3 is a schematic plan view of a wafer formed with a stencil for mounting a microbump tape coupon in accordance with one step of the method of the invention;

FIG. 4 is a schematic cross sectional view taken along section line 4—4 of FIG. 3;

FIG. 3A is a schematic plan view of a wafer having a microbump tape coupon mounted thereon in accordance with one step of the method of the invention;

FIG. 4A is a schematic cross sectional view taken along section line 4A—4A of FIG. 3A;

FIGS. 5A–5B are schematic cross sectional views illustrating additional steps in a method for forming an interconnect in accordance with the invention;

DETAILED DESCRIPTION OF THE PREFERRED EMBODIMENT

Figure 6:
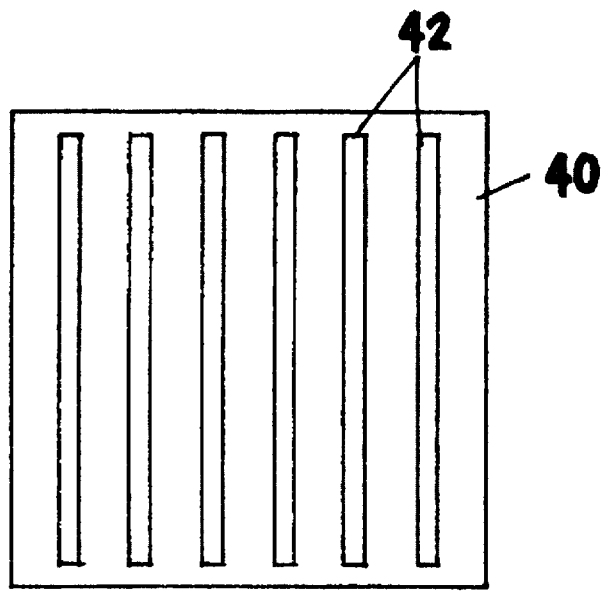
FIG. 6 is a schematic bottom view of a weight formed with grooves useful during a curing step during formation of an interconnect in accordance with the invention.

Referring to FIGS. 1 and 2, an interconnect 10 constructed in accordance with the invention is shown. The interconnect 10 includes: a substrate 14; a microbump tape 16 having a pattern of microbump contact members 12; and a compliant layer 18 for securing the tape 16 to the substrate 14. The microbump tape 16 includes an insulating film 20 (FIG. 2) and a pattern of conductors 22 in electrical communication with the microbump contact members 12.

The substrate 14 for the interconnect 10 has a size and peripheral outline that corresponds to the size and peripheral outline of a semiconductor die. The substrate 14 can be formed of a material such as silicon, silicon-on-sapphire, silicon-on-glass, germanium, metal or a ceramic. As will be further explained, the substrate 14 is preferably provided as a wafer of material which is saw cut to construct multiple interconnects 10.

The microbump tape 16 is similar in construction to two layer TAB tape used in tape automated bonding of semiconductor dice. The microbump tape 16 includes the insulating film 20 that is formed of a nonconductive and electrically insulating material such as a resin of polyimide, polyester, epoxy, urethane, polystyrene, silicone or polycarbonate. A metallic layer is formed on the insulating film 20, such as by electrodeposition, and is patterned and etched to form the conductors 22. The conductors 22 can be formed of a highly conductive metal such as aluminum, copper or nickel. By way of example, the conductors 22 can be formed with a thickness of from 15–35 m. This thickness forms the conductors 22 with a lower bulk modulus of resistivity than equivalent conductors formed using a thin film deposition process.

Figure 7:
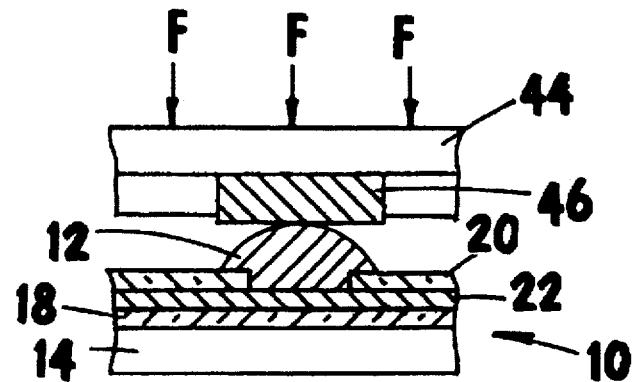
FIG. 7 is a schematic cross sectional view illustrating an interconnect constructed in accordance with the invention in electrical contact with a bond pad of a semiconductor die.

The conductors 22 terminate in conductor pads 22P (FIG. 1) that are wire bonded or otherwise electrically connected to mating contact pads on a testing apparatus wherein the interconnect 10 will be mounted. In addition, the microbump tape 16 can include alignment fiducials 48 (FIG. 1) formed of a printed or deposited material to aid in aligning the completed interconnect 10 with a die 44 (FIG. 7).

As clearly shown in FIG. 2, the microbumps 12 are formed with a hemispherical or convex shape and are adapted to contact and establish electrical communication with contact locations (e.g., bondpads 46—FIG. 7) on a die 44 (FIG. 7) held in the testing apparatus. Holes or vias are etched through the insulating film 20 and the microbumps 12 are formed in the vias in electrical communication with the conductors 22. The microbumps 12 can be formed of one or more layers of a conductive metal using a suitable process such as electrodeposition. Suitable metals for forming the microbumps 12 include Ni, Au, Cu and solder alloys. The microbumps 12 have a diameter of between about 8 m to 50 m.

U.S. Pat. No. 5,072,289 to Sugimoto et al. discloses one method for forming microbump tape 16 with microbumps 12. In addition, microbump tape 16 is commercially available from Nitto Denko, America, Inc. under the trademark ASMAT™. The microbump tape 16 is available in coupons 34 (FIG. 3A). Each coupon 34 contains multiple die patterns 32 (FIG. 3A) comprising microbumps 12 and conductors 22 that correspond to a pattern of bondpads for a particular type of semiconductor die. For example, Nitto ASMAT™ is available in 2"×2" coupons 34 (FIG. 3A) containing sixty die patterns 32. Each die pattern corresponds to a single semiconductor die and includes 15 m nickel microbumps having a 30 m pitch and formed on 13 m polyimide insulating film with 18 m conductors.

The compliant layer 18 for the interconnect 10 is formed of an adhesive material such as an epoxy or silicone elastomer. The compliant layer 18 functions to attach the microbump tape 16 to the substrate 14. In addition, the compliant layer 18 allows the microbump contacts 12 to move in a z-direction under loading to accommodate dimensional variations between the bond pads 46 (FIG. 7) of a semiconductor die 44 (FIG. 7) being tested.

Referring now to FIGS. 3 and 4, process steps used to construct the interconnect 10 are shown. Initially a substrate wafer 14W is provided. In the illustrative embodiment, the substrate wafer 14W is a blank silicon wafer used in the manufacture of semiconductor dice. The substrate wafer 14W has an outside diameter of about 6 inches and a thickness of about 18 mils. A stencil 24 is constructed on the substrate wafer 14W. The stencil 24 comprises two layers of stencil tape 26, 28 (FIG. 4) that is applied to the substrate wafer 14W. One suitable stencil tape 26, 28 is a single sided blue adhesive tape manufactured by Nitto Denko and having a thickness of about 3 mils (0.003 inches).

Still referring to FIGS. 3 and 4, the stencil tape 26, 28 is applied to the substrate wafer 14W and then trimmed to match the outer periphery of the substrate wafer 14W. In addition, a square cutout 30 is formed through both layers of stencil tape 26, 28. A quantity of adhesive 18A (FIG. 4) is then placed into the cutout 30 and spread out as indicated by the arrows in FIG. 3. The adhesive 18A will ultimately form the compliant layer 18 (FIG. 2). For a cutout 30 formed as 4 inches by 4 inches, about 0.8 cc of adhesive 18A is required.

The adhesive 18A is preferably initially applied to be thicker at the center of the cutout 30 but eventually will be formed into a layer of uniform thickness. One suitable adhesive is Zymet™ silicone elastomer manufactured by Zymet, Inc., East Hanover N.J. This type of adhesive is an endothermic curing elastomer that can be held in a freezer until it is ready to use. Alternately other suitable adhesives, such as two part epoxies or Kapton tapes, can be employed in place of silicone elastomers. The adhesive can be applied manually or by other methods of deposition, such as by screen printing for high viscosity adhesives, or by glob top dispensing for low viscosity adhesives. Furthermore, the method of the invention can be practiced by pre-applying an adhesive (e.g., silicone elastomer) and a release film to the backside of the coupon 34 rather than to the wafer 14W. In this case, the pre-applied adhesive and release film can be applied by the manufacturer of the coupon 34 or prior to construction of the interconnect 10.

As shown in FIGS. 3A and 4A, a coupon 34 containing multiple die patterns 32 is placed within the cutout 30 (FIG. 3) formed by the stencil 24. The coupon 34 is placed in contact with the adhesive 18A (FIG. 4A) with the microbumps 12 facing up. In addition, the coupon 34 is centered within the cutout 30 (FIG. 3).

With the coupon 34 in place on the substrate wafer 14W and as shown in FIG. 5A, a piece of protective film 36 is placed over the coupon 34. One suitable protective film is a polyester film that is placed or formed on the microbump surface of the coupon 34. With the protective film 36 protecting the coupon 34, a rolling weight 38 is repeatedly rolled over the coupon 34 and stencil 24 in different directions. This spreads the adhesive 18A to the sides so that the compliant layer 18 (FIG. 2) is formed with a uniform thickness. The excess adhesive can be wiped away with a cloth or rag.

Figure 6A:
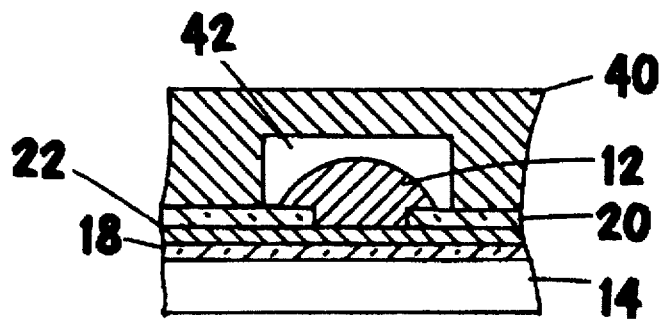
FIG. 6A is a schematic cross sectional view illustrating the positioning of the grooves with respect to microbump contact members during formation of an interconnect in accordance with the invention.

Next, as shown in FIG. 5B the protective film 36 is removed and a fresh piece of protective film 36 is placed over the coupon 34. A weight 40 is then placed on the protective film 36 to apply a force as indicated by the force arrows F. By way of example, the weight 40 can weigh about 2 lbs. The weight 40 allows the adhesive 18A to settle during a pre-cure step and prevents the coupon 34 from lifting away from the adhesive 18A prior to full curing. In addition, as shown in FIGS. 6 and 6A, the weight 40 can be formed with grooves 42 that are sized and placed to prevent direct contact of the weight 40 with the microbump contact members 12. Alternately in place of a weight 40, an air bladder can be used to apply a force during a portion of the curing process.

With the weight 40 in place, the assembly is placed in a curing oven at a temperature of about 120° C. for about one hour to pre-cure the adhesive 18A. The weight 40 and protective film 36 are then removed and a high temperature cure is performed. By way of example, the high temperature cure can be at a temperature of about 170° C. for about four hours minimum.

Following the curing process, the substrate wafer 14W is saw cut using a diamond tipped saw to singulate the individual die patterns 32 and form a plurality of interconnects 10. During the saw cutting step, the substrate wafer 14W is supported on a wafer film frame (not shown) that includes a sticky backing. This type of wafer film frame is used in semiconductor manufacture to support semiconductor wafers for singulation. The wafer film frame must be provided to prevent cracking of the silicon wafer 14W.

Referring now to FIG. 7, a cross section of the interconnect in use is shown. The interconnect 10 can be used with a testing apparatus for testing an unpackaged semiconductor die 44. The testing apparatus can be constructed as disclosed in U.S. Patent No. 5,408,190 which is incorporated herein by reference. Initially the interconnect 10 is mounted within the testing apparatus such that the conductor pads 22 (FIG. 1) on the interconnect 10 are in electrical communication with mating conductive elements (not shown) formed on the testing apparatus. By way of example, the conductor pads 22 can be wire bonded to corresponding bonding pads on the testing apparatus. With the interconnect 10 mounted within the testing apparatus, the die 44 is pressed against the interconnect 10 as denoted by the force arrows (F). A force distribution mechanism (not shown), as disclosed in the above cited patent, can be utilized to press the die 44 against the interconnect 10.

The testing apparatus is connectable to external test circuitry adapted to generate test signals for testing the operability of the integrated circuits formed on the die 44. The testing apparatus can include provision for aligning the bond pads 46, or other contact locations on the die 44, with the microbumps 12 on the interconnect 10. Alternately, optical alignment techniques such as flip chip optical alignment can be used to align the bond pads 46 on the die 44 with the microbump contact members 12 on the interconnect 10. The alignment fiducials 48 (FIG. 1) can be used to facilitate alignment. By way of example, an aligner bonder tool as described in U.S. Pat. No. 4,899,921 to Bendat et al. can be used to optically align the die 44 and interconnect 10.

Thus the invention provides a method for forming interconnects that are particularly useful in establishing a temporary electrical connection with semiconductor dice for testing. It is anticipated that such an interconnect can also be used in establishing a permanent electrical connection with semiconductor dice such as in the formation of multi-chip modules.

While the invention has been described with reference to certain preferred embodiments, as will be apparent to those skilled in the art, certain changes and modifications can be made without departing from the scope of the invention as defined by the following claims.

What is claimed is:

1. A method for forming an interconnect for establishing an electrical connection with a semiconductor die, comprising:

providing a tape comprising an electrically insulating film having a contact member thereon in electrical communication with a conductor;

providing a substrate for supporting the tape; and mounting the tape to the substrate by forming a cured elastomeric adhesive layer between the tape and substrate.

2. The method as claimed in claim 1 wherein the substrate comprises a material selected from the group consisting of silicon, silicon-on-sapphire, silicon-on-glass, germanium, metal and ceramic.

3. The method as claimed in claim 1 further comprising:

providing a coupon comprising a plurality of tapes;

providing a substrate wafer comprising a plurality of substrates;

attaching the coupon to the substrate wafer; and cutting the coupon and the substrate wafer to form a plurality of interconnects.

4. The method as claimed in claim 1 wherein the cured elastomeric adhesive layer comprises a silicone elastomer.

5. The method as claimed in claim 1 further comprising placing a weight on the tape during curing of the adhesive layer.

6. The method as claimed in claim 1 further comprising testing the die using the interconnect.

7. A method for forming an interconnect for establishing an electrical connection with a semiconductor die, comprising:

providing a tape comprising an electrically insulating film having a microbump contact member and a conductor in electrical communication with the microbump contact member;

providing a substrate for supporting the tape; and forming a compliant layer between the tape and substrate by attaching the tape to the substrate with an adhesive, said adhesive comprising a curable elastomeric material.

8. The method as claimed in claim 7 wherein the microbump contact member comprises a metal bump formed on a metal filled via through the film.

9. The method as claimed in claim 7 wherein the microbump contact member is formed on a first side of the film and the conductor is formed on a second side of the film.

10. The method as claimed in claim 7 wherein the curable elastomeric material comprises a silicone elastomer.

11. The method as claimed in claim 7 wherein the curable elastomeric material comprises epoxy.

12. The method as claimed in claim 7 further comprising:

providing the substrate on a wafer comprising a plurality of substrates;

providing the tape on a coupon comprising a plurality of individual patterns of microbump contact members and conductors corresponding to a particular die bond pad configuration;

mounting the coupon to the wafer with the adhesive therebetween; and singulating the wafer and coupon to form a plurality of interconnects.

13. The method as claimed in claim 12 further comprising applying the adhesive to the wafer prior to the mounting step.

14. The method as claimed in claim 12 further comprising applying the adhesive to the tape prior to the mounting step.

15. A method for forming an interconnect for establishing an electrical connection with a semiconductor die, comprising:

providing a tape comprising an electrically insulating film having a plurality of patterns of contacts corresponding to contact locations on the die and a plurality of patterns of conductors in electrical communication with the contacts;

providing a substrate wafer;

mounting the tape to the substrate wafer by placing an adhesive between the tape and substrate to form a compliant layer; and singulating the wafer and tape to separate the patterns of contacts and conductors to form a plurality of interconnects.

16. The method as claimed in claim 15 wherein the tape comprises a coupon having an adhesive layer attached thereto.

17. The method as claimed in claim 15 wherein the adhesive is applied to the substrate wafer and the tape is placed on the adhesive.

18. The method as claimed in claim 15 wherein the adhesive comprises a curable material and a weight is placed on the tape during curing of the curable material.

19. The method as claimed in claim 18 wherein the weight includes grooves configured to prevent direct contact of the weight and contacts.

20. The method as claimed in claim 15 further comprising forming a protective film on the tape and then rolling a weight over the protective film to compress the adhesive.

21. The method as claimed in claim 15 wherein the wafer comprises silicon.

22. The method as claimed in claim 15 wherein singulation the wafer and tape comprises saw cutting.

23. The method as claimed in claim 15 wherein the wafer is held on a wafer film frame during the singulation step.

24. A method for forming an interconnect for establishing electrical connections with a semiconductor die, comprising:

providing a coupon comprising an electrically insulating film including a plurality of patterns of microbump contacts configured to electrically connect to contact locations on the die, and a plurality of patterns of conductors in electrical communication with the microbump contacts;

providing a substrate wafer;

forming a stencil with an opening on the wafer;

applying an adhesive to the wafer;

placing the coupon within the opening on the adhesive;

compressing the coupon against the adhesive;

curing the adhesive; and cutting the wafer to separate the patterns of microbump contacts and conductors to form a plurality of interconnects.

25. The method as claimed in claim 24 further comprising placing a weight on the coupon during the curing step.

26. The method as claimed in claim 24 further comprising compressing the coupon against the adhesive using a bladder.

27. The method as claimed in claim 24 wherein the substrate wafer comprises a material selected from the group consisting of silicon, silicon-on-sapphire, silicon-on-glass, germanium, metal and ceramic.

28. The method as claimed in claim 24 wherein cutting the wafer and coupon comprises placing the wafer on a wafer film frame and saw cutting.

29. The method as claimed in claim 24 wherein compressing the coupon against the adhesive comprises applying a rolling weight.

30. The method as claimed in claim 29 further comprising placing a protective film between the coupon and rolling weight.

* * * * *